Nov. 7, 1967 C. W. FARROW 3,351,868

PHASE LOCKED LOOP WITH FAST FREQUENCY PULL-IN

Filed Feb. 2, 1966

2 Sheets-Sheet 1

INVENTOR
C. W. FARROW
BY
[signature]
ATTORNEY

Nov. 7, 1967 C. W. FARROW 3,351,868

PHASE LOCKED LOOP WITH FAST FREQUENCY PULL-IN

Filed Feb. 2, 1966 2 Sheets-Sheet 2

United States Patent Office 3,351,868

Patented Nov. 7, 1967

3,351,868

PHASE LOCKED LOOP WITH FAST FREQUENCY PULL-IN

Cecil W. Farrow, Monmouth Hills, N.J., assignor to Bell Telephone Laboratories, Incorporated, New York, N.Y., a corporation of New York Filed Feb. 2, 1966, Ser. No. 524,551
7 Claims. (Cl. 331—17)

ABSTRACT OF THE DISCLOSURE

A phase locked loop in which an EXCLUSIVE-OR circuit is employed to compare the phase difference between a received synchronizing signal and an output signal from a countdown circuit driven by an output from a voltage controlled oscillator. The received signal is also employed to periodically reset the counter circuit to alleviate phase ambiguity and insure a maximum lock-in range.

This invention relates to a phase locked oscillator loop, and it relates more particularly to such loops which are required to achieve initial frequency pull-in in a minimum amount of time.

In certain electrical systems utilizing automatic adjustment of locally generated oscillations a phase locked oscillatory loop is often employed. Such loops usually include low-pass filter circuitry for providing a control signal to a voltage controlled oscillator. It is known in the art that in such phase locked loops the capture, or pull-in, frequency range of the loop is significantly less than the locking, or hold-in, frequency range. Consequently, the designer must exercise considerable care in order to avoid any situation which might cause the loop to slip out of the capture range and into a part of the range which includes only lockin-functions of the loop. The reason for such caution is that if the loop is operating in a region characterized by only locking functions and no capture capability, it will settle into stable operation at some frequency other than the input signal frequency on which the loop is supposed to lock.

It is known in the art that it is possible to increase the capture range of a phase locked loop by certain circuit modifications, but these modifications usually entail sacrifice in the stability of the locked condition in that it is then more subject to jitter in response to input signal disturbances. It is also known that prior art circuits with their relatively narrow pull-in ranges experience prolonged bipolar hunting during pull-in because capacitive elements in the low-pass filter circuits of the loop are repeatedly charged to a first polarity, discharged, and then charged to a second polarity.

It is, therefore, one object of the invention to improve the operation of phase locked oscillator loops.

It is another object to increase the pull-in frequency range of a phase locked loop with respect to the hold-in range thereof.

A further object is to reduce the time required for a phase locked loop to pull into its locked condition of operation.

Still another object is to improve voltage controlled oscillators in phase locked loops so that reduced loop pull-in time may be realized.

These and other objects of the invention are realized in an illustrative embodiment wherein an oscillatory circuit is arranged in a phase locked loop circuit so that both the phase and the frequency of operation of the oscillatory circuit are adjusted to achieve a predetermined relationship between the phase of an input signal to the loop and the phase of an output signal of the oscillatory circuit. The phase adjustment is accomplished in a ratchet type of operation each time the polarity of phase error between the signals is reversed.

It is one feature of the invention that the combination of frequency and phase adjustment causes the pull-in and hold-in ranges of operation of the phase locked loop to be essentially the same.

It is another feature that low-pass filter circuitry is used to integrate a phase error signal which controls the frequency of the oscillatory circuit, and the use of an error-polarity-responsive phase adjustment forces capacitive elements in such filter circuitry to charge substanstantially continuously in a unipolar fashion toward a charge condition corresponding to a locked condition of operation of the phase locked loop.

Yet another feature is that the low-pass filter circuits are arranged in a double-rail logic format so that they can produce a bipolar output control signal while the capacitive elements thereof are subjected to only unipolar charging conditions. That is, during any given pull-in operation of the phase locked loop, the charge on any one capacitive element in the filter circuits may either increase or decrease; but the polarity of such charge, and the direction of charging, is not reversed once a pull-in operation is begun. The use of the double-rail format eliminates the need for a reference voltage source dependent upon the characteristics of circuit devices in the circuits which develop a frequency control signal for the oscillatory circuit.

A further feature is that the oscillatory circuit includes a feedback circuit which is responsive to a double-rail logic control signal for adjusting oscillator frequency.

A more complete understanding of the present invention and its various features and objects may be obtained from a consideration of the following detailed description in connection with the appended claims and the attached drawing in which:

Figure 1:
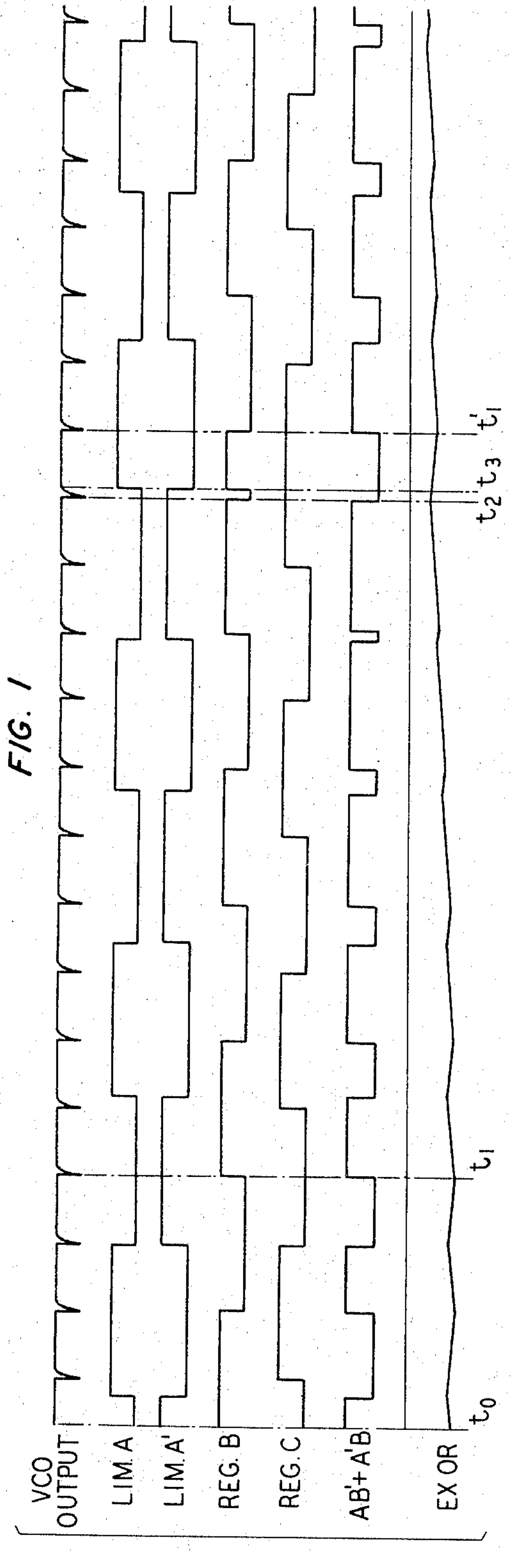
FIG. 1 is a family of timing diagrams illustrating the operation of the invention.
Figure 2:
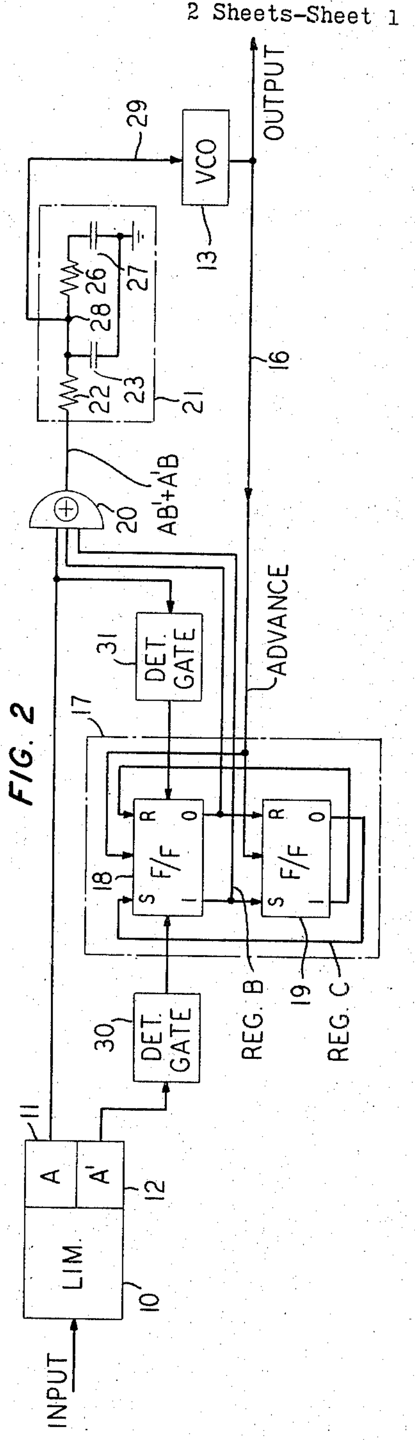
FIG. 2 is a simplified block and line diagram of a phase locked circuit in accordance with the invention.

In FIG. 1 the timing diagrams are all presented on a common time scale extending from left to right to represent an illustrative time interval during a pull-in operation of the phase locked loop in FIG. 2. In that loop circuit an input signal wave from any suitable source is applied to a limiter circuit 10. The input signal may, for example, comprise a pilot tone which is received along with data signals in a data receiving terminal (not shown) for use in connection with the local production of carrier and timing frequency signals at such terminal. Circuits 11 and 12 derive from limiter 10 double-rail logic, i.e., complementary, output signals which are utilized for controlling the frequency of a voltage controlled oscillator 13. Circuits 11 and 12 produce the signals LIM A and LIM A′ diagrams illustrated in FIG. 1 and which are the complement of one another. Oscillator 13 provides at least one of the desired output signals for the terminal; and such output, in the form of negative-going impulses, is represented by the timing diagram VCO OUTPUT in FIG. 1.

A circuit 16 couples the output of oscillator 13 for driving both stages of a two-stage re-entrant shift register 17, and the oscillator and register together comprise an oscillatory circuit in the phase locked loop. The register 17 includes a first bistable multivibrator circuit 18 and a second similar circuit 1. The two multivibrators are coupled in tandem with the outputs of the stage 19 being coupled back to the inputs of the stage 18. The register 17 counts down the frequency of the output wave from voltage controlled oscillator 13 to a level which is comparable to the frequency of the input signal provided by the limiter 10. In some systems additional timing output signals are advantageously derived from different bistable circuit output connections of the register 17 because such output connections from a re-entrant shift register provide symmetrical subharmonic output waves which are in precise quadrature phase relationship with respect to one another. This feature is illustrated by the REG B and REG C timing diagrams in FIG. 1 which represent signal condition changes at the binary ONE and ZERO output connections of the bistable circuits 18 and 19, respectively.

An EXCLUSIVE OR circuit 20 compares the phases of the output signal from limiter 10 and the double-rail output from the bistable circuit 18. EXCLUSIVE OR circuit 20 provides an output signal $AB'+A'B$ to low-pass filter circuits 21. This output is illustrated in FIG. 2 on a single-rail logic basis for convenience in explaining the operation of the invention. However, as will be shown in connection with FIG. 3, the output and the filter are advantageously arranged on a double-rail logic basis.

The output signal from EXCLUSIVE OR circuit 20 has a magnitude which indicates the comparative phase status of the input signals applied thereto. This output signal $AB'+A'B$ is illustrated in FIG. 1 and is low for coincidence of input signals LIM A and REG B but high for the anticoincidence, the EXCLUSIVE OR, condition of such signals. Coincidence is here used to indicate simultaneous presence of either high signals or low signals. The manner of operation of the EXCLUSIVE OR circuit in the phase locked loop can be seen in FIG. 1 by considering the diagrams LIM A' and REG B to represent the signals from limiter 10 and bistable circuit 18 which are compared by the EXCLUSIVE OR circuit. At time $t_0$ the two waves are out of phase with respect to one another. At time $t_1$ they are approximately in quadrature phase relationship, and at time $t_2$ they are nearly in phase coincidence. It can be seen that during the interval between times $t_0$ and $t_2$ the EXCLUSIVE OR circuit operates increasingly in its anticoincidence condition thereby applying a signal with an increasing average value to the filter 21. Approximate variations in this average are represented by the EX OR wave diagram in FIG. 1 for the illustrated case wherein the frequency of signals from limiter 10 is initially lower than the frequency of signals from bistable circuit 18. In that case the EX OR diagram moves positively toward a reference line representing the average value of $AB'+A'B$ for phase quadrature in a single-rail circuit. Of course, that average is zero for a double-rail circuit. The EX OR diagram would move negatively toward the same reference if the frequency of circuit 18 were initially lower than the frequency of the limiter signals.

Low-pass filter 21 has the appearance of two low-pass filter L-sections in tandem with an output connection from a common circuit point 28 between the sections. This arrangement of the filter elements with respect to the output is believed to permit between the two sections an interaction that is not otherwise available and which contributes to loop stability after pull-in. In the first section resistor 22 and capacitor 23 have a comparatively short time constant which is, however, much longer than the period of the input signal from limiter 10. The resistor 26 and capacitor 27 in the second section of filter 10 have a much longer time constant than does the first section. However, with respect to the output terminal 28, the resistor 26 and capacitor 23 have a time constant that is still smaller than that of resistor 22 and capacitor 23, though still much longer than the period of the limiter output. Thus, resistor 26 and capacitor 23 represent the principal responsive elements for relatively fast changes in the input signal to the filter. Similarly, the resistor 22 and capacitor 27 have a time constant much larger than any in the filter 21 and provide long term stability to the output signal on lead 29.

An upper limit is imposed upon the time constant of resistor 26 and capacitor 23 such that oscillator 13 does not experience fast drift from its locked frequency in response to noise. Similarly, a lower limit is imposed on the time constant of resistor 22 and capacitor 27 to prevent slow drift of the oscillator in response to noise.

Both of the last-mentioned limits are determined for a particular circuit by well known techniques. Thus, the the transfer function for the phase locked loop is expressed and different sets of values for resistors 22 and 26 and capacitors 23 and 27 are inserted therein to determine by trial and error a set of solutions for such function which, by their form, are recognized to represent stable operation of the loop. That is, operation that will not include hunting in response to noise disturbances in the limiter output which alter signal transition times and thereby cause improper disturbances in the output of EXCLUSIVE OR circuit 20.

In one embodiment of the invention wherein the limiter input signal was a 2400 cycles-per-second wave and oscillator 13 operated at 9600 cycles per second, two of the filters 21 were employed on a double-rail logic basis and each had resistances of 470,000 ohms and 47,000 ohms for resistors 22 and 26, respectively, and had capacitances of 0.25 microfarad and 200 microfarads for capacitors 23 and 27, respectively.

Circuit terminal 28 between the resistors 22 and 26 is common to the two low-pass filter sections and is connected by a circuit 29 for applying an analog phase error signal to the oscillator 13. This signal magnitude is dependent upon the different time constants of the low-pass filter 21. The analog signal causes oscillator 13 to adjust its frequency of operation thereby altering the phase relationship of the operation of the countdown circuit with respect to the input signal from limiter 10. The direction of change is such as to reduce the magnitude of the error signal thereby bringing the oscillator 13 into a phase locked condition with respect to the input signal from limiter 10. In that condition, of course, all of the outputs of the re-entrant shift register 17 are similarly locked to the phase of the input signal from limiter 10. In this locked condition the waves LIM A' and REG B are in quadrature with the latter lagging.

In accordance with one aspect of the present invention, two detector gates 30 and 31 also compare the phases of the signals from limiter 10 and the signals from the bistable circuit 18. These gates are adapted so that a change in the phase error polarity from that initially prevailing at the beginning of pull-in causes the output of limiter 10 to trigger the bistable circuit 18 thereby changing the phase of operation of the shift register 17 with respect to the output of voltage controlled oscillator 13. Thus, for the illustrated embodiment the apparent phase difference is primarily in the zero-degree to 90-degree range to cause consistent operation of filter 21. This electronic ratchet type of action restores the original polarity of phase error between bistable circuit 18 and the signals from limiter 10. The pull-in operation from an initial state with REG B lagging, and utilizing detector gate 30, is illustrated in FIG. 1. The result of the phase adjustment of the countdown circuit 17 in conjunction with the frequency adjustment of the oscillator 13, as previously described, is to cause the phase locked loop of FIG. 2 to pull into its locked phase condition much more rapidly than is the case in the absence of such gates. The manner in which this is achieved can be seen by referring once more to FIG. 1 and the diagrams LIM A' and REG B therein.

Initially at time $t_0$ in FIG. 1 there is some phase error between the wave diagrams LIM A' and REG B, and in the form illustrated in LIM A' diagram leads the REG B diagram. In accordance with the normal operation of the phase locked loop hereinbefore described, the output of EXCLUSIVE OR circuit 20 charges the capacitors 23 and 27 in low-pass filter 21 and the resulting increase in the analog signal on circuit 29 causes oscillator 13 to adjust its frequency in a direction which tends to reduce the phase error. Such frequency changes in the VCO output are not readily detectable in the scale of the drawing of FIG. 1. However, the result thereof is to shift the negative-going transitions of the REG B diagram initially toward phase quadrature with those of the LIM A′ diagram. Just prior to time $t_1$ the two diagrams are characterized by a 90-degree phase error, or difference, which is, in fact, the desired condition for phase lock. However, the time lag resulting from the long time constants in the low-pass filter 21 has prevented the charges on the capacitors in that filter from keeping step with the phase conditions of the two waves, as is well known in the art. Consequently, oscillator 13 continues to adjust its frequency in accordance with the slower rate of change in the signal on circuit 29.

At time $t_2$ it is seen that the negative-going transition of the REG B diagram no longer lags the LIM A′ diagram and, in fact, leads the latter diagram to a small extent. Consequently, gate 30 is enabled in a manner which will be apparent from the subsequent description of FIG. 3 so that upon the occurrence of the negative-going transition in the LI MA′ diagram at time $t_3$ the bistable circuit 18 is triggered. Subsequently, at time $t_1'$ the VCO OUTPUT wave triggers the bistable circuit 18 once more. The result of these two triggering actions of that bistable circuit within the space of a single cycle of the VCO output, is to inject a substantial jump in the phase error between the wave diagrams LIM A′ and REG B. However, the nature of the phase jump is such that the response of EXCLUSIVE OR circuit 20 to these two signals is similar to the former response at time $t_1$, with the REG B diagram lagging the LIM A′ diagram again. Consequently, capacitors 23 and 27 in the low-pass filter 21 continue to charge in the same direction that they had been charging prior to time $t_1$ and toward the same voltage condition corresponding to a 90-degree phase lag between the two signals compared by EXCLUSIVE OR circuit 20. There is, thus, no significant change in the polarity of the rate of charge of the capacitors and no significant overshoot in the control applied to oscillator 13.

The operations of the circuit between the times $t_1$ and $t_1'$ are repeated many times as capacitors 23 and 27 are charged toward the condition representing phase quadrature. However, each time the total interval involved spans a greater number of cycles of the output of oscillator 13 because more time is required to drift out to the phase coincident state as LIM A′ and REG B approach frequency equality. Ultimately the time required for such phase drift will be greater than the time required for filter 21 to change the control signal on lead 29; and the small final pull-in adjustment is then completed by only frequency changes in oscillator 13. These latter changes are, however, accomplished without significant overshoot because the phase error with respect to the locked state has been reduced to such a small magnitude.

The circuit has been described with respect to operation with REG B lagging LIM A′ for pull-in, utilizing gate 30, to the illustrated condition of phase quadrature. If the REG B wave initially were leading LIM A′, gate 31 would be utilized in a similar manner for pull-in to the condition of phase quadrature. Thus, the pull-in range of the phase-locked loop covers 360 electrical degrees of the LIM A wave, and the circuit will always pull in to the desired quadrature state corresponding to that shown at about time $t_1$ in FIG. 1.

It should be noted that, in the absence of the detector gates 30 and 31 at the start of initial pull-in from a large phase error state, the phase of the REG B wave diagram would be continuously shifted through alternate periods of leading and lagging phase error of approximately equal, but gradually decreasing, duration as the phase locked loop creeps up on its ultimate phase quadrature condition. Each swing through phase quadrature during such pull-in operation without the detector gates 30 and 31 involves a reversal of significant duration in the polarity of the charging rate of capacitors 23 and 27 which necessarily prolongs total phase pull-in time because of the large bipolar overshoot caused in the control signal applied to oscillator 13. This latter type of pull-in operation without the aid of detector gates 30 and 31 has been found to require a total time for pull-in which is at least an order of magnitude longer than the time required for pull-in with the assistance of the detector gates 30 and 31.

Figure 3:
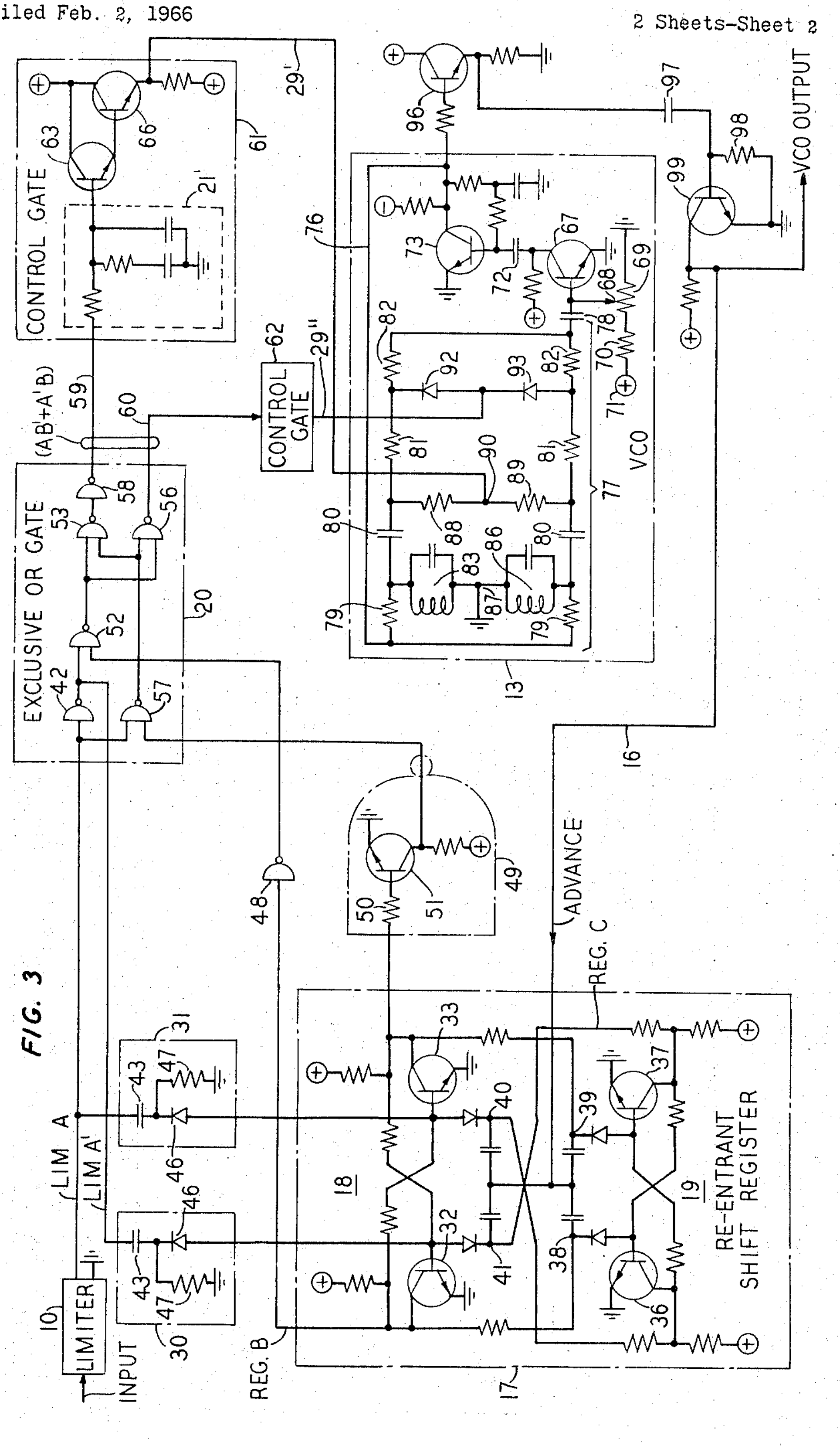
FIG. 3 is a schematic diagram illustrating the details of the embodiment of FIG. 2.

FIG. 3 shows schematic detail of the embodiment of FIG. 2. The shift register 17 includes two transistors 32 and 33 in the bistable multivibrator circuit 18 and two transistors 36 and 37 similarly connected in the bistable circuit 19. Each of the bistable circuits includes a complementing input connection of the capacitor-diode type for receiving shift register advance pulses from oscillator 13 on the circuit 16. The diodes in these input connections are poled so that the shift register is responsive to only the negative-going transitions of the VCO OUTPUT wave in a manner that is well known in the art. The collector electrodes of transistors 32 and 33 are coupled to terminals 38 and 39, respectively, which are between the corresponding capacitor and diode that couple advance circuit 16 to the base electrodes of transistors 36 and 37. Collector electrodes of the latter two transistors are similarly coupled to terminals 40 and 41, respectively, in the input connections of the bistable circuit 18. This arrangement of crosscoupled multivibrators causes the triggering of each multivibrator to be dependent upon the conducting condition of the other so that each negative-going transition in the VCO OUTPUT wave on circuit 16 triggers only one of the two multivibrators.

Thus, each positive-going transition of the VCO OUTPUT wave blocks all of the diodes in the complementing input connections of the multivibrators 18 and 19. However, each negative-going transition triggers into a nonconducting condition the one of the four multivibrator transistors which has its base electrode crosscoupled to the collector electrode of a conducting transistor. For example, assume that transistors 33 and 36 are conducting when a negative-going transition occurs in the VCO OUTPUT wave. Transistors 32 and 37 are already in their nonconducting conditions are required by normal bistable multivibrator operation so those transistors are not immediately affected by the input signal transition. The base electrode of the conducting transistor 36 is crosscoupled to the collector electrode of the nonconducting transistor 32 so that the negative-going input signal transition is unable to pull the terminal 38 below ground potential and is thus unable to affect the conduction of transistor 36. However, the base electrode of transistor 33 is crosscoupled to the collector electrode of the conducting transistor 36 so that the terminal 40 is at approximately ground potential prior to the aforementioned input signal transition. Consequently, such transition pulls the terminal 40 to a negative potential with respect to ground thereby drawing current from the collector supply source of transistor 32 so that the base electrode of transistor 33 is pulled to a negative potential and that transistor is thereby biased to a nonconduction condition.

Conduction is regeneratively transferred to the transistor 32 as transistor 33 is biased off in accordance with normal bistable multivibrator operation. However, the resulting negative-going voltage transition at the collector electrode of transistor 32 is direct-current coupled to terminal 38 and to the base electrode of transistor 36 so that it has no effect upon the conduction of multivibrator 19. Each subsequent negative-going transition in the VCO OUTPUT wave triggers a different one of the four shift register transistors in a similar manner to produce the output waves REG B and REG C in phase quadrature as illustrated in FIG. 1. These waves appear at the collector electrodes of transistors 32 and 37, respectively.

The output of limiter 10 in FIG. 3 is unbalanced with respect to ground, and a balanced signal is desired as previously noted in connection with FIG. 2. For this purpose the unbalanced output is directly connected to the input of detector gate 31, and the inverted form of that output after coupling through an inverting gate 42 in the EXCLUSIVE OR circuit 20 is applied to the detector gate 30. This gate 42 corresponds to the A′ deriving circuit 12 shown in FIG. 2, while the coupling lead from limiter 10 to detector gate 31 corresponds to the deriving circuit 11 in FIG. 2.

Each of the gates 30 and 31 is a differentiating gate which comprises a series-connected capacitor 43 and diode 46 with a common intermediate terminal connected through a resistor 47 to ground. Gates 30 and 31 couple their respective forms of the limiter output to base electrodes of transistors 32 and 33, respectively. The diodes 46 are poled for conduction away from multivibrator 18 so that only negative-going transitions in the respective forms of the limiter output signal can affect the operation of the multivibrator. If a multivibrator transistor is conducting when a limiter output signal waveform coupled thereto has a negative-going transition, the transistor base electrode is pulled to a negative potential thereby terminating conduction in the transistor so that multivibrator action transfers the conducting condition to the other transistor of the multivibrator. Thus, in terms of the diagrams in FIG. 1, when the LIM A′ diagram has a negaive-going transition at the same time that transistor 32 is conducting, e.g., as at time $t_3$ in FIG. 1, the base electrode of transistor 32 is pulled to a negative potential thereby triggering the multivibrator to turn off transistor 32 and turn on transistor 33. It will be understood from the previous discussion of the operation of multivibrators 18 and 19 that the resulting negative-going signal transition at the collector electrode of transistor 33 does not affect the operation of multivibrator 19.

Similarly, if the LIM A diagram includes a negative-going transition at the same time that transistor 33 is conducting, conduction in multivibrator 18 is transferred from that transistor to transistor 32 without affecting the operation of multivibrator 19. In either case, the occurrence of a negative-going transition at one of the gates 30 or 31 at a time when the corresponding multivibrator transistor is in a nonconducting state cannot change the conducting condition of such transistor. Consequently, the gates 30 and 31 operate to detect a reversal in the polarity of phase error between signals produced by limiter 10 and by multivibrator 18 and the detection of such reversal, e.g., from a lagging to a leading relationship as illustrated in FIG. 1, causes the limiter output to trigger multivibrator 18 and thereby restore the previous phase polarity relationship.

Collector electrode output signal waves from each transistor of multivibrator 18 are coupled through inverting gates 48 and 49, respectively, to the EXCLUSIVE OR circuit 20. Each of the gates 48 and 49, as well as the aforementioned gate 42, has the schematic configuration represented for gate 49 and includes a series input resistor 50 for coupling input signals to the base electrode of a transistor 51 that is connected in a common emitter amplifier circuit. Transistor 51 is nonconducting for ground input signals, and it conducts in saturation for positive input signals. The inverted gate output appears at the collector electrode of transistor 51. The same type of circuit can be utilized as a coincidence gate for ground signals by connecting each of a plurality of input circuits to the base electrode of transistor 51 through its own individual series resistor 50 in a manner that is well known in the art. Of course, in the coincidence application, any positive input signal causes the gate to produce the ground output signal. The schematic representation enclosing in broken-line form the gate 49 is utilized for all similar inverting and coincidence gates in the drawing.

The inverted REG B wave in the output of gate 48 is coupled to an input of a coincidence gate 52 along with the LIM A′ signal wave. The output of gate 52 is coupled to an input connection of each of two coincidence gates 53 and 56. The latter gates also receive from a gate 57 a signal wave indicating the comparative condition of the LIM A wave and the inverted output of transistor 33, i.e., the REG B wave. Thus if the LIM A output and the REG B outputs are in the same low condition, gate 57 is enabled and produces a high output signal; and at the same time gate 52 is disabled by two high input signals and produces a low output signal. Thus, gates 53 and 56 are disabled by the single high input from gate 57, and reversal of input states to gates 52 and 57 simply causes the disabling signal for gates 53 and 56 to come from gate 52. The ground output from gate 53 is inverted by a gate 58 to produce a high signal on a lead 59 so that the output from EXCLUSIVE OR circuit 20 comprises a double-rail logic signal on leads 59 and 60 with the lead 59 being more positive with respect to ground than the lead 60.

If now the LIM A wave and REG B wave are in different conditions the double-rail output of EXCLUSIVE OR circuit 20 is reversed in polarity. For example, when the LIM A wave is high and the REG B wave is ground, gate 52 is disabled because it receives at least one high input signal and its output is therefore in the low voltage condition. At this same time the output from transistor 33 must be high, thereby placing the corresponding input to gate 57 also in the high condition so that gate 57 is disabled; and its ground output, together with the similar output from gate 52 enables gates 53 and 56. The resulting high outputs thereof are coupled to leads 59 and 60 with lead 60 being more positive with respect to ground than is lead 60. This is a reversal of the polarity conditions of those two leads from their state when LIM A and REG B were in the same state.

Leads 59 and 60 are coupled to oscillator 13 through control gates 61 and 62. Since both of the latter gates are the same, the details of only gate 61 are shown. Thus, such gate includes in the input thereof a low-pass filter circuit 21′ corresponding to the filter 21 of FIG. 2 and including tandem-connected sections of low time constant and high time constant with an intermediate terminal therebetween providing the filter output. In this case the output of filter 21′ is coupled to the base electrode of a transistor 63 that is arranged with another transistor 66 in a Darlington connected emitter-follower circuit. This emitter-follower arrangement is biased for operating in the linear portion of its characteristic for all signal amplitudes which are connected to be received from the filter 21′.

Circuits 29′ and 29″ couple the outputs of gates 61 and 62 to oscillator 13 and these outputs comprise the double-rail logic control signal for the oscillator. Thus, when the EXCLUSIVE OR circuit 20 is operating on approximately a 50 percent duty cycle, i.e., with wave diagrams LIM A′ and REB B in phase quadrature, the voltages with respect to ground on leads 29′ and 29″ are of approximately the same magnitude so that the difference is essentially zero. However, significant long-time departures from the 50 percent duty cycle cause one of the leads to become more positive than the other and thereby apply a difference voltage control signal to oscillator 13.

Oscillator 13 is an inductance-capacitance type of oscillator with two stages of amplification and a regenerative feedback circuit around those stages. The first stage includes a transistor 67 arranged in a common emitter circuit and lightly biased for conduction in the absence of feedback by a connection to tap 68 on a potential divider including resistors 69 and 70 connected across a potential source 71. The output from the collector electrode of transistor 67 is coupled through a capacitor 72 to the base electrode of another transistor 73 that is also arranged in a common emitter circuit and normally biased for conduction in the absence of feedback. A feedback circuit 76 is connected from the collector electrode of transistor 73 through a balanced control impedance network 77 and a coupling capacitor 78 to the base electrode of transistor 67. Network 77 includes two branch paths each having in series connection, in the order named, a resistor 79, a capacitor 80, a resistor 81, and a resistor 82 between the lead 76 and the capacitor 78.

Two parallel resonant circuits 83 and 86 are connected in series across the series combination of the two resistors 79, and a common circuit terminal 87 between the resonant circuits 83 and 86 is connected to ground. One of the two resonant circuits is tuned to a natural resonant frequency, which is above a desired operating frequency of the voltage controlled oscillator 13, and the other resonant circuit is tuned to a frequency below that desired operating frequency. Two resistors 88 and 89 are connected in series between the common circuit junctions between series connected capacitor 80 and resistor 81, and a common circuit terminal 90 between resistors 88 and 89 is connected to lead 29′ for receiving one part of the oscillator frequency control signal. A pair of diodes 92 and 93 are connected in series between the circuit junctions common to resistors 81 and 82 in each branch path; and the common circuit terminal between diodes 92 and 93, which are poled in the same direction, is connected to the lead 29″ for receiving the other part of the oscillator control signal.

The appearance of a voltage difference between leads 29′ and 29″ drives a current through one of the diodes 92 or 93 to the one of the resistors 81 and one of the resistors 88 or 89. Conduction in this manner through one of the diodes provides a relatively low impedance path to ground from the corresponding capacitor 80 through the resistor 81, such diode, and the gate 62. Thus, the impedances connected across the corresponding resonant circuit have a lower total impedance than do those across the other resonant circuit so that the frequency of the latter circuit is favored and the oscillator operates at a frequency which is betwen the resonant frequencies of the two resonant circuits. However, such frequency is closer to the frequency of the resonant circuit that is characterized by a higher shunt impedance.

Thus, if lead 29′ is more positive than lead 29″, diode 93 conducts and provides a low impedance path to ground through that diode and the emitter circuit resistor of gate 62. Consequently, resonant circuit 83 has the higher shunt impedance and oscillator 13 operates at a frequency which is closer to the resonant frequency of circuit 83 than it is to the frequency of circuit 86. Changes in the magnitudes of the signals on leads 29′ and 29″ occur in complementary fashion to increase or decrease conduction in one of the diodes 92 or 93 thereby changing the effective impedances shunting the two resonant circuits and changing the frequency at which oscillator 13 operates.

The output of oscillator 13 is coupled through an emitter follower stage including a transistor 96 to a capacitor 97 which, together with a resistor 98, comprises a differentiating circuit for sharpening output signal transitions from oscillator 13. An inverter including a transistor 99 couples the negative-going differentiated impulses as the VCO OUTPUT wave to the lead 16 for providing advance signals to the re-entrant shift register 17. The same output is also available for external utilization, as previously described.

Thus, the illustrated circuits establish and maintain a first predetermined frequency and phase relationship between the outputs of limiter 10 and the oscillatory circuit including oscillator 13 and register 17. This relationship corresponds to phase quadrature between the LIM A′ and REG B waves. The phase deviation between those two waves is detected by EXCLUSIVE OR circuit 20, and the sense of the deviation with respect to a phase coincidence state of the outputs of limiter 10 and register 17 is detected by gates 30 and 31. Those gates cooperate with circuit 20 to control the oscillator 13.

During a phase pull-in operation of the phase-locked loop of the invention, a reversal of phase error polarity from the condition at which pull-in operation started is detected by the reset gates 30 and 31. These gates cause multivibrator 18 in the countdown circuit to be triggered and thereby digitally restore the original phase error polarity in a ratchet type of operation. Such triggering also establishes a phase quadrature relationship between the countdown circuit operation and the loop input signal. This operation causes capacitors in the loop low-pass filters to see no more than one transition through a 50 percent duty cycle of their input signal. Thus, those capacitors continue to charge in a substantially uniform fashion, once a pull-in operation has been initiated, to establish the 50 percent duty cycle as the locked state.

Although the present invention has been described in conection with a particular embodiment thereof, it is to be understood that additional embodiments and modifications which will be apparent to those skilled in the art are included within the spirit and scope of the invention.

What is claimed is:

1. A circuit for adjusting a voltage controlled oscillator to provide an output signal having a frequency and phase related to a received signal comprising:

a countdown circuit responsive at a first input to said output signal for advancing said countdown circuit to provide a countdown signal, and at a second input to said received signal to bring said countdown circuit to a predetermined condition; and means responsive to the phase relationship between said received signal and said countdown signal for adjusting the frequency of said voltage controlled oscillator.

2. The circuit in accordance with claim 1 in which:

nonsymmetrical impedance means are provided for coupling said received signal to said countdown circuit.

3. The circuit in accordance with claim 1 in which said phase responsive means comprises:

an EXCLUSIVE-OR gate; and a low-pass filter coupling the output of said EXCLUSIVE-OR gate to said voltage controlled oscillator, said filter having a time constant which is substantially longer than the period of said received signal.

4. The phase locked circuit in accordance with claim 3 in which said filter comprises:

a first section coupling the output of said EXCLUSIVE-OR gate to said voltage controlled oscillator and having a time constant substantially longer than the period of said received signal; and a second section coupled across the output of said first section and having a substantially larger time constant than said first section.

5. The phase locked circuit in accordance with claim 3 in which:

said EXCLUSIVE-OR gate has two output connections for presenting its output in double-rail logic form; and said filter includes separate paths for coupling each of said gate output connections to said oscillator.

6. In combination:

an oscillator including a first tuned circuit tuned to a first frequency having a shunt impedance responsive to a control signal for providing an output signal having a frequency and phase related to a received signal;

a countdown circuit responsive at a first input to said output signal for advancing said countdown circuit to provide a countdown signal, said countdown circuit being responsive at a second input to said received signal to bring said countdown circuit to a predetermined condition; and means responsive to the phase relationship between said received signal and said countdown signal to provide said control signal.

7. The combination as defined in claim 6 in which said oscillator also includes:

a second tuned circuit tuned to a second frequency connected in parallel with said first tuned circuit, said second tuned circuit having a shunt impedance inversely responsive to said control signal.

References Cited

UNITED STATES PATENTS

| | | | |
|---|---|---|---|
| 2,932,793 | 4/1960 | Smith et al. | 331—17 |
| 2,962,666 | 11/1960 | Pollak | 331—17 |
| 3,130,375 | 2/1964 | Haynes | 254—150 |
| 3,259,851 | 7/1966 | Brauer | 331—25 |

ROY LAKE, *Primary Examiner.*

S. H. GRIMM, *Assistant Examiner.*